United States Patent
Mlcousek et al.

(10) Patent No.: US 7,535,276 B2
(45) Date of Patent: May 19, 2009

(54) METHOD OF FORMING A PWM CONTROLLER AND STRUCTURE THEREFOR

(75) Inventors: Radim Mlcousek, Frenstat (CZ); Pavel Latal, Roznov (CZ)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 93 days.

(21) Appl. No.: 11/749,542

(22) Filed: May 16, 2007

(65) Prior Publication Data

US 2008/0284479 A1  Nov. 20, 2008

(51) Int. Cl.
*H03K 3/017* (2006.01)
(52) U.S. Cl. ................................ 327/175; 327/172
(58) Field of Classification Search .................. None
See application file for complete search history.

(56) References Cited

U.S. PATENT DOCUMENTS

| | | | | |
|---|---|---|---|---|
| 4,694,504 A | * | 9/1987 | Porter et al. ............... | 398/191 |
| 5,070,754 A | * | 12/1991 | Adamson ................... | 84/454 |
| 6,204,649 B1 | * | 3/2001 | Roman ....................... | 323/282 |
| 6,304,462 B1 | | 10/2001 | Balakrishnan et al. | |
| 7,123,494 B2 | * | 10/2006 | Turchi ........................ | 363/89 |
| 2003/0174005 A1 | * | 9/2003 | Latham et al. ............. | 327/172 |
| 2008/0157894 A1 | * | 7/2008 | Hariton et al. ............. | 332/109 |

OTHER PUBLICATIONS

Data Sheet, 'NCP1239 Low-Standby High Performance PWM Controller', Copyright Semiconductor Components Industries, LLC, Oct. 2005—Rev.5, 38 pps.
Data Sheet, 'NCP1280 Active Clamp Voltrage Mode PWM Contrtoller for Off-Line Applications', Copyright Semiconductor Components Industries, LLC, Feb. 2005—Rev. 3, 18 pps.
Data Sheet, 'NCP1337 PWM Current-Mode Controller for Free Running Quasi-Resonant Operation', Copyright Semiconductor Components Industries, LLC, Jul. 2006—Rev. 2, 14 pps.

* cited by examiner

*Primary Examiner*—Cassandra Cox
(74) *Attorney, Agent, or Firm*—Robert F. Hightower

(57) ABSTRACT

In one embodiment, a PWM controller is configured to form a drive signal that has an operating frequency that varies around a center by a percentage of the center frequency.

16 Claims, 2 Drawing Sheets

METHOD OF FORMING A PWM CONTROLLER AND STRUCTURE THEREFOR

BACKGROUND OF THE INVENTION

The present invention relates, in general, to electronics, and more particularly, to methods of forming semiconductor devices and structure.

In the past, the semiconductor industry utilized various methods and structures to produce pulse width modulated (PWM) power supply controllers. In some applications, it was important to control the maximum power that was delivered by a power supply system to a load. Some prior PWM controllers provided for adjusting the maximum duty cycle of a drive signal that was produced by the PWM controller. However, these prior PWM controllers did not accurately limit the maximum power delivered to load. One example of such a prior PWM controller is disclosed and U.S. Pat. No. 6,304,462 that issued to Balakrishnan et al on Oct. 16, 2001.

In other applications, it was important to set the frequency of the drive signal. However, the prior PWM controllers did not accurately set the frequency.

Accordingly, it is desirable to have a PWM controller that accurately limits the maximum power delivered to load, that can set the duty cycle of the PWM drive signal to limit the maximum power delivered to the load, and that can accurately set the frequency of the drive signal without affecting the duty cycle.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

DETAILED DESCRIPTION OF THE DRAWINGS

Figure 1:
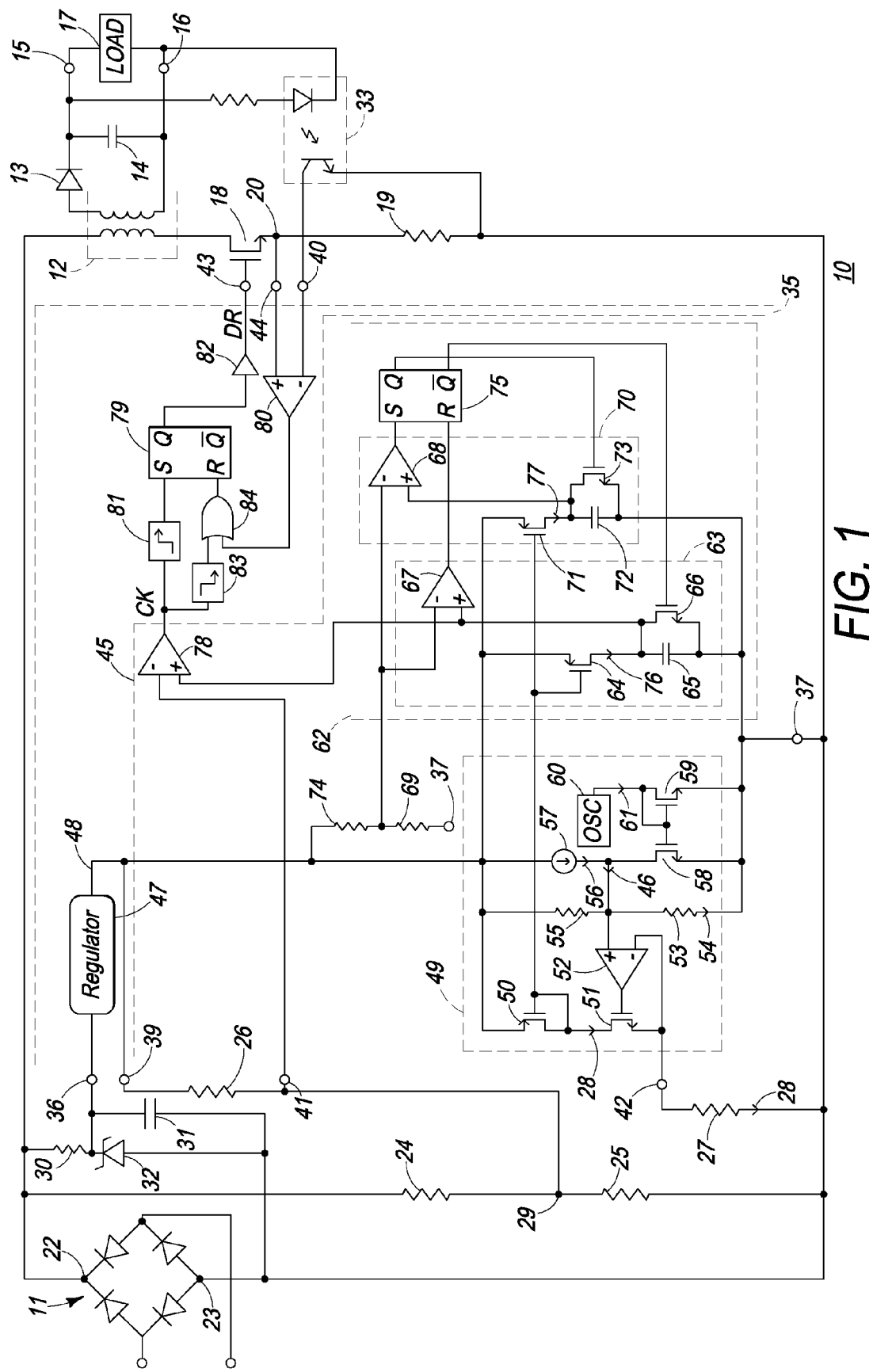
FIG. 1 schematically illustrates an embodiment of a portion of a power supply system that includes a pulse width modulated (PWM) controller in accordance with the present invention.

FIG. 1 schematically illustrates an embodiment of a portion of a power supply system 10 that includes a pulse width modulated (PWM) controller 35. Controller 35 is configured to form a PWM drive (DR) signal that operates at an operating frequency. As will be seen further hereinafter, the operating frequency has a center frequency and varies around the center frequency by a maximum amount and a minimum amount that is a percentage of the center frequency. Controller 35 is also configured to vary the duty cycle of the PWM drive (DR) signal without affecting the operating frequency. The center frequency is selected in response to a signal on one input of controller 35 and the duty cycle is selected responsively to another signal on a second input of controller 35.

System 10 receives power between a pair of inputs that are connected to a bridge rectifier 11. The power generally is receive from a bulk supply such as a house-hold mains. System 10 receives an input voltage from rectifier 11 between a power input terminal 22 and a power return terminal 23 and forms a regulated output voltage between a voltage output terminal 15 and an output return terminal 16. A load 17 generally is connected between terminals 15 and 16 to use the regulated output voltage as an operating voltage for load 17. The secondary side of system 10 usually also includes a rectifier diode 13 and a filter capacitor 14. An opto-coupler 33 usually is used to form a feedback signal that is representative of the output voltage between terminals 15 and 16. A resistor (not shown) may be included within controller 35 as a pull-up of the output of opto-coupler 33. A power switch such as a power transistor 18 is utilized to control current flow through a primary winding of a transformer 12 in order to regulate the value of the output voltage between terminals 15 and 16. A current sense resistor 19 generally is connected in series with transistor 18 to form a current sense signal at a node 20 that is utilized to assist in controlling the value of the output voltage. Transformer 12 generally includes a secondary winding that is connected in the secondary side of system 10. System 10 may also include a pre-regulator for controller 35 that receives a bulk voltage from terminals 22 and 23 of rectifier 11. The pre-regulator may include a resistor 30, a zener diode 32, and a filter capacitor 31.

Controller 35 generally receives an input voltage between a voltage input 36 and a voltage return 37 of controller 35. The input voltage is used to form an operating voltage for operating controller 35. Input 36 generally is connected to terminal 22 and return 37 generally is connected to terminal 23. Controller 35 includes a duty cycle control input 41, a frequency control input 42, a PWM drive output 43, and a current sense input 44. An oscillator circuit 45 of controller 35 is utilized to form a clock (CK) signal that controls the frequency and the maximum duty cycle of the PWM drive (DR) signal on output 43. Oscillator circuit 45 is configured to set a PWM latch 79 in order to initiate a period of the PWM drive (DR) signal. A comparator 80 receives the current sense signal from an input 44 and the feedback signal from an input 40, and forms an output that is utilized to reset latch 79 in order to terminate the period of the PWM drive (DR) signal responsively to the output voltage and current through transistor 18. A negative edge detector 83 and an OR gate 84 facilitate limiting the maximum duty cycle of the DR signal, thus, limiting the maximum power delivered to the secondary side of transformer 12. In the preferred embodiment illustrated in FIG. 1, oscillator circuit 45 includes a first oscillator portion 63 that is used to generate an on-time of the clock (CK) signal, a second oscillator portion 70 that assist in forming an off-time of the CK signal, a latch 75, and a control circuit 49 that assist in forming the operating frequency of the CK signal and of the DR signal. Control circuit 49 assists in selecting the center frequency of the CK and DR signals and also assists in selecting the percentage that the operating frequency varies around the center frequency. In this preferred embodiment, first oscillator portion 63 includes a current source transistor 64, a capacitor 65, and a discharge transistor 66, and a comparator 67. Similarly, second oscillator portion 70 includes a current source transistor 71, a capacitor 72, a discharge transistor 73, and a comparator 68. A resistor divider that includes resistors 69 and 74 is used to generate a first reference signal that is used by comparators 67 and 68. Control circuit 49 includes a current source 57, a low frequency oscillator (OSC) 60, current mirror coupled transistors 58 and 59, and a voltage to current conversion circuit that includes a resistor 53, an amplifier 52 and cascode coupled transistor 51 and current sensing transistor 50. Transistor 50 is configured as an input transistor of a current mirror with transistors 64 and 71 configured as mirror transistors of the current mirror. Controller 35 may also include an internal regulator 47 that is connected between input 36 and return 37 in order to receive the input voltage and form an operating voltage on an output 48.

In operation, current source 57 forms a substantially constant current 56. Low frequency oscillator 60 generates a current 61 that varies in value according to the frequency of oscillator 60. Oscillator 60 generally varies the value of current 61 at a low frequency, such as around two hundred Hertz (200 Hz). Current 61 flowing through transistor 59, as the input transistor of the current mirror of transistors 58 and 59, forms a current through transistor 58, as the mirror transistor of the current mirror. The average value of the current through transistor 58 is subtracted by the value of current 56 resulting in a bi-directional current 46. The value of current 46 is summed to the current through the resistor divider of resistors 53 and 55 to form a current 54 that flows through resistor 53. The value of currents 56 and 61 and the current mirror ratio of transistors 58 and 59 are selected so that the peak-to-peak values of the modulated voltage across resistor 53 is a fixed ratio of its mean value. For example for a mean value of about two volts (2 V) and a fixed ratio of about plus-or-minus six percent (+−6%), the peak-to-peak values would be about 2.12 and 1.88 volts. Current 54 forms a voltage across resistor 53 that varies as the value of current 54 varies. The varying voltage is received by the voltage to current converter of amplifier 52 and transistor 51. Amplifier 52 receives the voltage from resistor 53 and forms a voltage on input 42 that is substantially equal to and varies with the value of the voltage across resistor 53. The voltage on input 42 causes a current 28 to flow through resistor 27. Consequently, the value of resistor 27 determines the value of current 28. Current 28 also flows through transistor 50. Because transistor 50 is connected in a current mirror configuration with transistors 64 and 71, the value of current 28 is mirrored to flow through also transistor 64 and transistor 71 as respective currents 76 and 77. Since the voltage across resistor 53 varies with the variations in current 54, the value of current 28 in addition to currents 76 and 77 also vary responsively to current 54.

Assuming that latch 75 is set, current 76 flowing through transistor 64 charges capacitor 65 until the value of the voltage across capacitor 65 reaches the value of the reference voltage applied to comparator 67. The charging of capacitor 65 forms a substantially ramp shaped signal. As the value of the voltage across capacitor 65 reaches the value of the control signal received on input 41, the output of comparator 78 goes high. Positive edge detector 81 receives the high going output of comparator 78 and forms a positive going pulse that sets PWM latch 79 and initiate a cycle of the DR signal on output 43. The output of comparator 78 remains high as capacitor 65 continues to charge (in some embodiments, detector 81 may not be required). When the voltage across capacitor 65 charges to a value that is no less than the first reference voltage from resistor 69, the output of comparator 67 goes high to reset latch 75. Resetting latch 75 forces the Q bar output high to enable transistor 66 and discharge capacitor 65 thereby forcing the output of comparator 78 low. It can be seen that the time interval used for charging capacitor 65, from the value of the voltage on input 41 to the first reference signal from resistor 69, controls the on-time portion of the clock (CK) signal. Negative edge detector 83 receives the low going output of comparator 78 and forms a positive going pulse. In the event that the output voltage and current conditions are such that comparator 80 has not gone high to reset latch 79, the positive going pulse from edge detector 83 forces the output of gate 84 high for a time interval that is sufficient to reset latch 79. Resetting latch 79 from the negative going edge of the CK signal allows controller 35 to limit the duty cycle of the DR signal and limit the amount of power delivered to load 17 in response to the signal received on input 41. The low Q output of latch 75 disables transistor 73 and allows current 77 to begin charging capacitor 72. The value of current 77 is used to charge capacitor 72 until the voltage across capacitor 72 reaches a value that is greater than the first reference signal from resistor 69. When the value of the voltage across capacitor 72 is no less than the first reference signal, the output of comparator 68 goes high to set latch 75. Setting latch 75 forces the Q output high to enable transistor 73 and discharge capacitor 72. The low Q bar output again disables transistor 66 and again allows current 76 to charge capacitor 65. The output of comparator 78 remains low until the value of the voltage formed on capacitor 65 again reaches the value of the control signal on input 41 which forces the output of comparator 78 high again thereby again setting latch 79 and initiating another cycle of the DR signal. Thus, the off-time of the CK signal is controlled by the time interval used to charge capacitor 72 to the first reference signal from resistor 69 plus the time interval required to charge capacitor 65 to the voltage received on input 41. The value of the current used to charge capacitors 65 and 72 is set by the value of resistor 27 and current 28. As the value of current 28 varies responsively to current 54, the time interval required to charge capacitors 65 and 72 also varies thereby varying the frequency of the CK signal. Typically, the value of the control signal received on input 41 is less than the first reference voltage on resistor 69. Also, capacitor 65 usually is greater than the value of capacitor 72 so that the maximum duty cycle of the CK signal is greater than fifty percent (50%). In the preferred embodiment, the value of capacitors 65 and 72 are selected so that the maximum duty cycle is approximately eighty percent (80%).

The point at which comparator 78 goes high as the ramp signal from capacitor 65 increases is selected by the value of the signal received on input 41. The higher the value of the signal on input 41, the shorter the on-time of the CK signal, thus, the shorter the duty cycle of the CK signal. Resistors 24, 25, and 26 form a resistor divider that forms a voltage on a node 29 that is representative of the bulk voltage. Resistors 26 and 25 form a resistor divider that generates a voltage that is a fixed ratio to the voltage on output 48 of regulator 47 (through a connection to output 39) while resistors 24 sums in a voltage that is representative of the value of the bulk voltage. The ratio between resistors 24 and 26 scales the sensitivity of the voltage on node 29 to the value of the bulk voltage. The greater the value of the ratio of resistor 24 divided by resistor 26, the greater the sensitivity to the bulk voltage. The value of the signal on input 41 sets the duty cycle of the CK signal and the duty cycle of the DR signal. As the value of the bulk voltage on terminal 22 of rectifier 11 varies, the voltage formed on input 41 also varies, thus the duty cycle varies as the bulk input voltage varies. As the value of the bulk voltage increases, the duty cycle decreases to make sure that the amount of power delivered to load 17 remains substantially constant. If the duty cycle remained constant as the bulk voltage increased, the amount of power delivered to load 17 would also increase. Similarly, as the value of the bulk voltage decreases, the duty cycle increases to make sure that the amount of power delivered to load 17 remains substantially constant. If the duty cycle remained constant as the bulk voltage decreased, the amount of power delivered to load 17 would also decrease. It can be seen that the time interval used for charging capacitor 65, from the voltage on input 41 to the first reference signal from resistor 69, controls the on-time portion of the CK signal while the off-time of the CK signal is given by time interval used to charge capacitor 65 to the voltage received on input 41 and to charge capacitor 72 to the first reference signal from resistor 69.

In order to implement this functionality for controller 35, input 42 is connected to receive the first control signal and is commonly connected to a source of transistor 51 and an inverting input of amplifier 52. An output of amplifier 52 is connected to a gate of transistor 51. A drain of transistor 51 is connected to a drain and a gate of transistor 50, a gate of transistor 64, and a gate of transistor 71. A source of transistor 50 is commonly connected to output 48 of regulator 47, a first terminal of current source 57, a source of transistor 64, and a source of transistor 71. A drain of transistor 64 is commonly connected to a first terminal of capacitor 65, a drain of transistor 66, a non-inverting input of comparator 67, and a non-inverting input of comparator 78. A second terminal of capacitor 65 is commonly connected to a source of transistor 66 and return 37. A drain of transistor 71 is commonly connected to a first terminal of capacitor 72, a drain of transistor 73, and a non-inverting input of comparator 68. A second terminal of capacitor 72 is commonly connected to a source of transistor 73 and return 37. An inverting input of comparator 67 is commonly connected to an inverting input of comparator 68, a first terminal of resistor 74 and a first terminal of resistor 69. A second terminal of resistor 74 is connected to output 48 of regulator 47, and a second terminal of resistor 69 is connected to return 37. An output of comparator 68 is connected to a set input of latch 75. An output of comparator 67 is connected to a reset input of latch 75. A Q output of latch 75 is connected to a gate of transistor 73. A Q bar output of latch 75 is connected to a gate of transistor 66. The output of oscillator 60 is commonly connected to a drain and a gate of transistor 59, and a gate of transistor 58. A source of transistor 59 is connected to return 37 and a source of transistor 58. A drain of transistor 58 is commonly connected to a second terminal of current source 57, a non-inverting input of amplifier 52, a first terminal of resistor 55, and a first terminal of resistor 53. A second terminal of resistor 55 is connected to output 48 of regulator 47. A second terminal of resistor 53 is connected to return 37. An inverting input of comparator 78 is connected to receive the second control signal from input 41. An output of comparator 78 is commonly connected to an input of each of edge detectors 81 and 83. An output of edge detector 81 is connected to a set input of latch 79. A Q output of latch 79 is connected to an input of buffer 82 which has an output connected to output 43. Input 44 is connected to a non-inverting input of comparator 80 which has an inverting input connected to input 40. An output of comparator 80 is connected to a first input of gate 84. A second input of gate 84 is connected to an output of edge detector 83. An output of gate 84 is connected to a reset input of latch 79.

Figure 2:
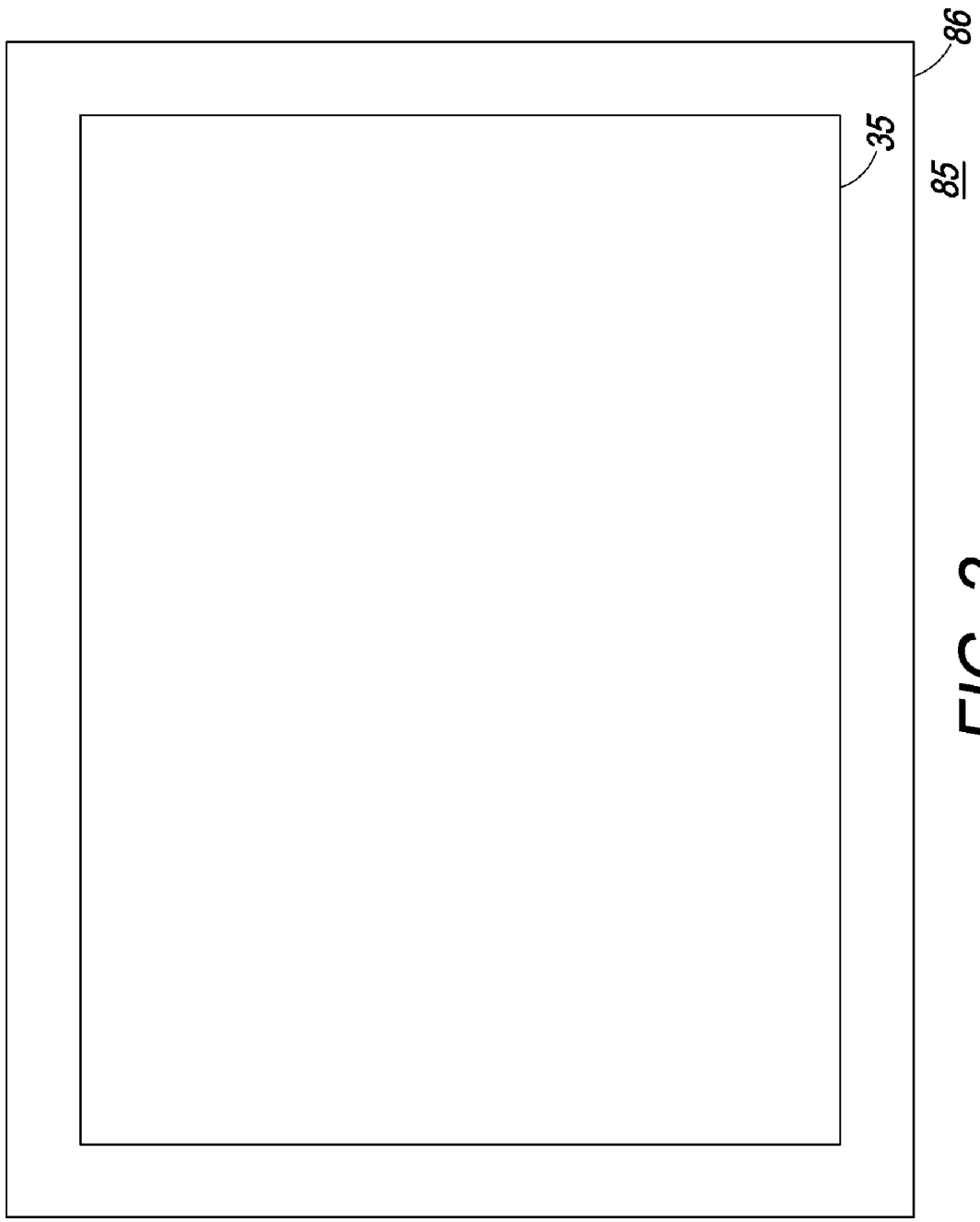
FIG. 2 schematically illustrates an enlarged plan view of a semiconductor device that includes the power system of FIG. 1 in accordance with the present invention.

FIG. 2 schematically illustrates an enlarged plan view of a portion of an embodiment of a semiconductor device or integrated circuit 85 that is formed on a semiconductor die 86. Controller 35 is formed on die 86. Die 86 may also include other circuits that are not shown in FIG. 2 for simplicity of the drawing. Controller 35 and device or integrated circuit 85 are formed on die 86 by semiconductor manufacturing techniques that are well known to those skilled in the art.

In view of all of the above, it is evident that a novel device and method is disclosed. Included, among other features, is forming a PWM controller to form a drive signal that has an operating frequency that varies around a center by a percentage of the center frequency. Forming a first current source to set a center frequency and then form a second current that varies a percent of the fixed current source facilitates forming the percentage variation of the operating frequency.

While the subject matter of the invention is described with specific preferred embodiments, it is evident that many alternatives and variations will be apparent to those skilled in the semiconductor arts. For clarity of the explanation, the operation of the preferred embodiment of controller 35 was explained, however, other embodiments should provide similar operation. Additionally, other embodiments of PWM latch 79 may be used. For example, a latch that has two reset inputs may be used instead of latch 79 and gate 84. For example, oscillator 62 can have a different topology or control circuit 49 can have a different voltage-to-current converter. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A PWM controller comprising:
a first input configured to form a first signal;
a second input configured to receive a second signal that varies responsively to a maximum peak value of a bulk voltage;
an oscillator circuit having a first portion that forms an on-time of a clock signal formed by the oscillator circuit and having a second portion that forms an off-time of the clock signal;
a first control circuit of the oscillator circuit configured to control the first portion and the second portion to form an operating frequency of the clock signal, the first control circuit configured to set a center frequency of the operating frequency responsively to the first signal formed on the first input and configured to vary the operating frequency around the center frequency a maximum and minimum amount that is a percent of the center frequency; and
a second control circuit of the oscillator circuit configured to vary a maximum duty cycle of the clock signal responsively to the second signal from the second input.

2. The PWM controller of claim 1 wherein the first control circuit is configured to form a first current through the first input and to use the first current to vary the on-time and the off-time.

3. The PWM controller of claim 2 wherein the first control circuit varies a value of the first current the percent around a center value of the first current.

4. The PWM controller of claim 2 wherein the first control circuit includes a current source that forms a first control current having a first value that is approximately a positive one half of the percent of the first value of the first control current.

5. The PWM controller of claim 4 wherein the first control circuit includes a control oscillator that forms a second control current having a second value that is approximately a negative half of the percent of the first value of the first control current.

6. The PWM controller of claim 5 wherein the first control circuit is configured to sum the first control current and second control current to form the first current wherein the first current varies the percent around the value of the first control current.

7. The PWM controller of claim 5 further including a first current mirror having an input portion that receives the second control current and a mirror portion that receives the first control current wherein the current mirror sums the first and second control currents to form a summed current.

8. The PWM controller of claim 7 further including a voltage-to-current converter that receives a voltage that is representative of the summed current and forms an input current through the first input that is representative of the summed current, and including a second current mirror having an input portion coupled to the first input to receive the summed current and for a charging current that is representative of the summed current.

9. The PWM controller of claim 8 further including a first mirror portion of the second current mirror coupled to supply a first charging current to a first capacitor wherein the first charging current controls a charging time of the first capacitor and also controls the on-time of the clock signal.

10. The PWM controller of claim 9 further including a second mirror portion of the second current mirror coupled to supply a second charging current to a second capacitor wherein the second charging current controls a charging time of the second capacitor and also controls the off-time of the clock signal.

11. The PWM controller of claim 1 wherein the clock signal is used to control a frequency of a switching control signal that is used to control a power switch that is used to regulate an output voltage to a desired value.

12. A method of forming an oscillator of a PWM controller comprising:
    configuring an oscillator circuit to form a clock signal having an operating frequency and to form a center frequency of the operating frequency responsively to a first signal on a first input of the oscillator circuit;
    configuring the oscillator circuit to vary the operating frequency a percent of the center frequency around the center frequency; and
    configuring the oscillator circuit to vary a duty cycle of the operating frequency responsively to a second signal received on a second input of the oscillator circuit.

13. The method of claim 12 wherein configuring the oscillator circuit to form the clock signal having the operating frequency includes coupling a current source to form a first control current having a first value and to form a second control current having a second value that is summed to cause the first value to vary the percent.

14. The method of claim 13 wherein configuring the oscillator circuit to form the clock signal having the operating frequency includes configuring the oscillator circuit to use the first and second control currents to control a charging interval of a first capacitor to set an on-time of the clock signal and to use the first and second control currents to control a charging interval of a second capacitor to set an off-time of the clock signal.

15. The method of claim 14 further including coupling a first comparator to compare a voltage on the first capacitor to a reference value and responsively control the on-time.

16. The method of claim 15 further including coupling a second comparator to compare a voltage on the second capacitor to the reference value and responsively control the off-time.

* * * * *